(12) United States Patent
Klein

(10) Patent No.: US 6,727,733 B2
(45) Date of Patent: Apr. 27, 2004

(54) OUTPUT DRIVER CIRCUIT AND METHOD FOR ADJUSTING A DRIVER DEVICE

(75) Inventor: Ralf Klein, München (DE)

(73) Assignee: Infineon Technologies AG, Munich ( * ) Notice: Subject to any disclaimer, the term of this patent is extended or adjusted under 35 U.S.C. 154(b) by 0 days.

(21) Appl. No.: 10/235,050

(22) Filed: Sep. 5, 2002

(65) Prior Publication Data

US 2003/0042942 A1 Mar. 6, 2003

(30) Foreign Application Priority Data

Sep. 5, 2001 (DE) .......................... 101 43 421

(51) Int. Cl.$^7$ ................................ H03B 1/00
(52) U.S. Cl. ...................... 327/108; 327/276
(58) Field of Search ................ 327/108–112, 170, 327/276, 277, 238; 326/83

(56) References Cited

U.S. PATENT DOCUMENTS

| | | | | |
|---|---|---|---|---|
| 4,540,933 A | * | 9/1985 | Teuling | 323/271 |
| 5,185,538 A | * | 2/1993 | Kondoh et al. | 327/109 |
| 6,137,327 A | | 10/2000 | Schnell | 327/158 |

* cited by examiner

*Primary Examiner*—Long Nguyen
(74) *Attorney, Agent, or Firm*—Laurence A. Greenberg; Werner H. Stemer; Gregory L. Mayback

(57) ABSTRACT

An output driver circuit includes a delay device disposed between a signal input and a driver device. The input signal to the driver device can be delayed by a predetermined value with the delay device. The signal amplitude of the output signal from the driver device is compared, in a comparison device, with the signal amplitude of a reference signal at a predetermined time. The time delay for the input signal to the driver device is then set on the basis of the comparison result. A method for adjusting a driver device is also provided.

4 Claims, 6 Drawing Sheets

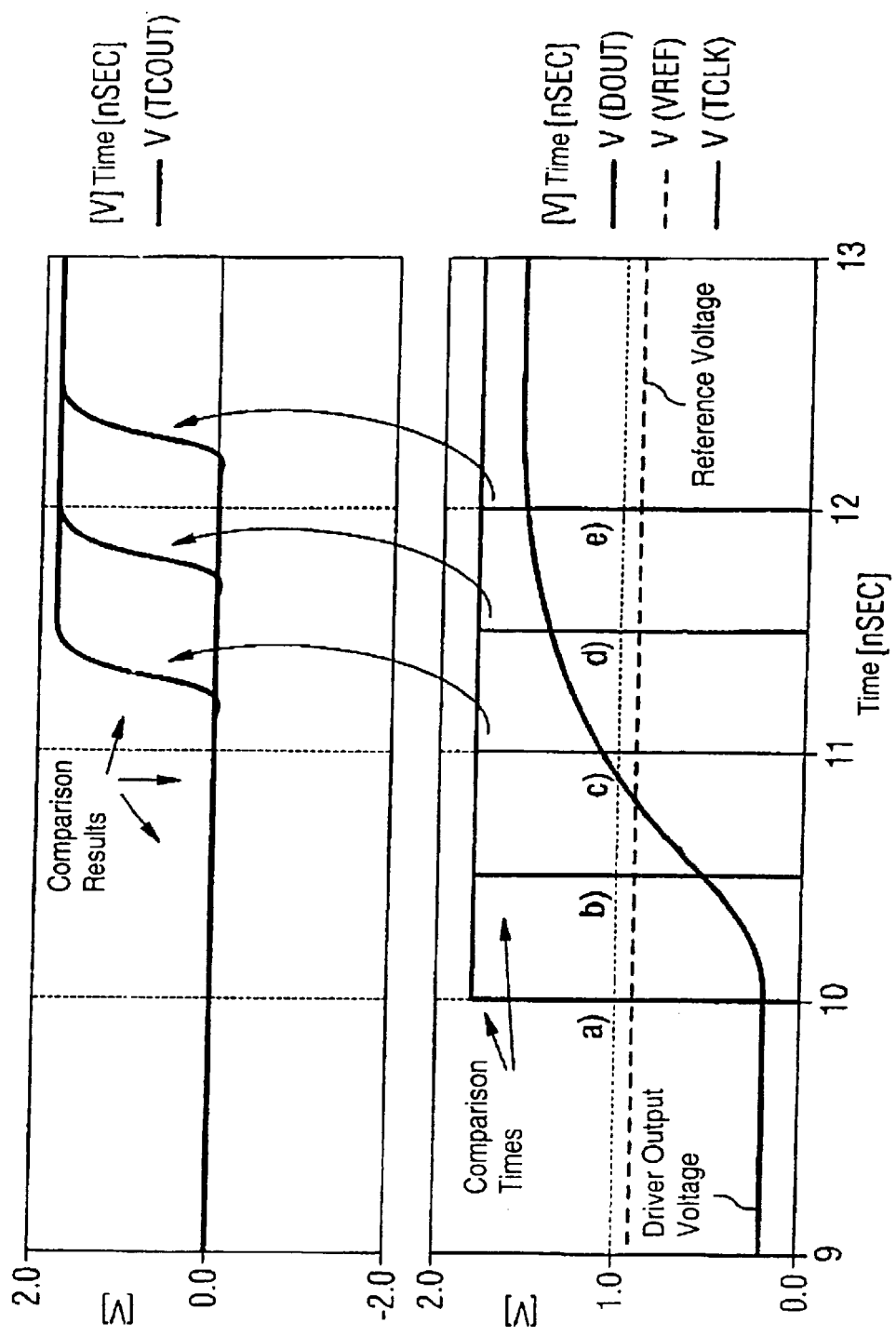

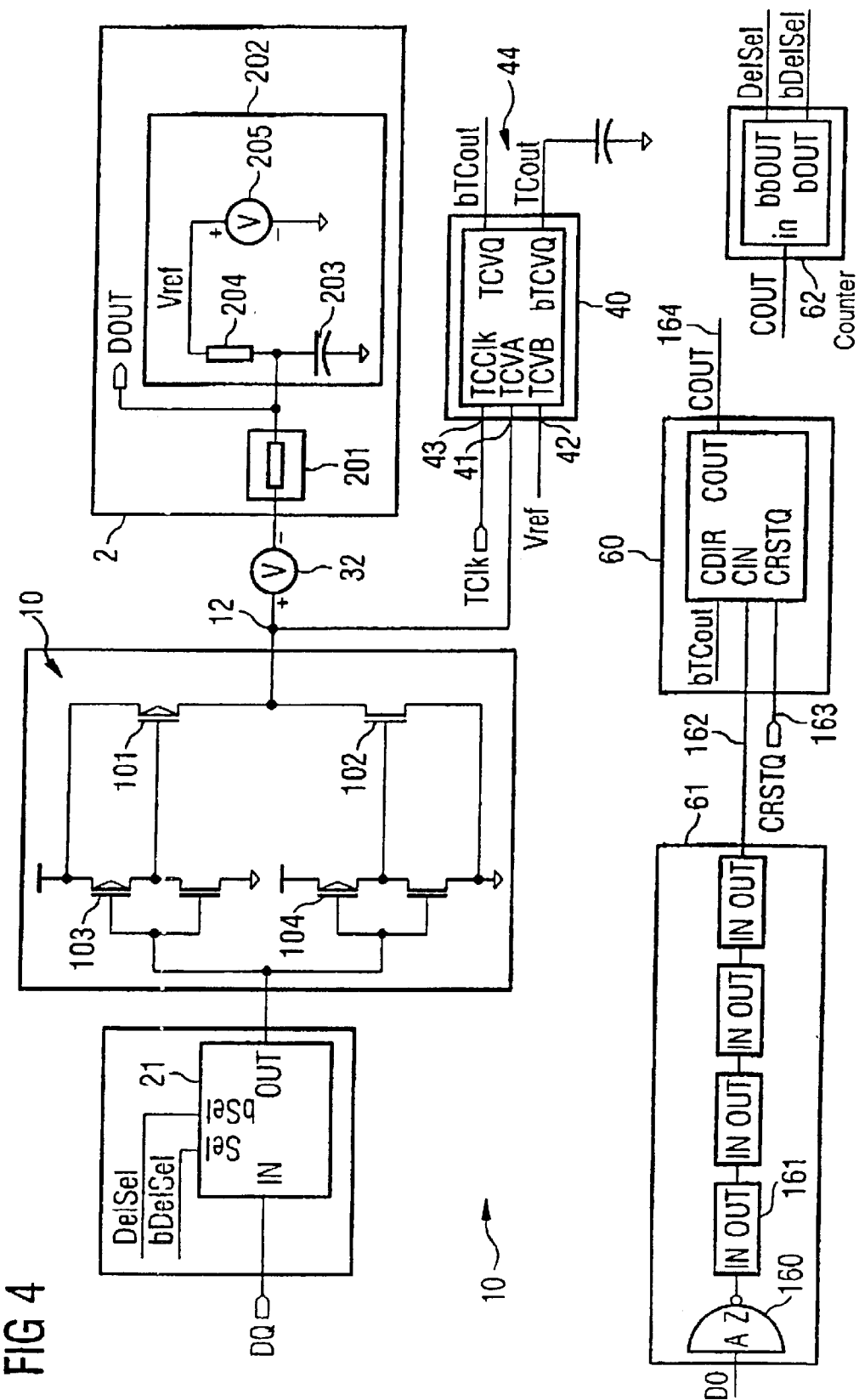

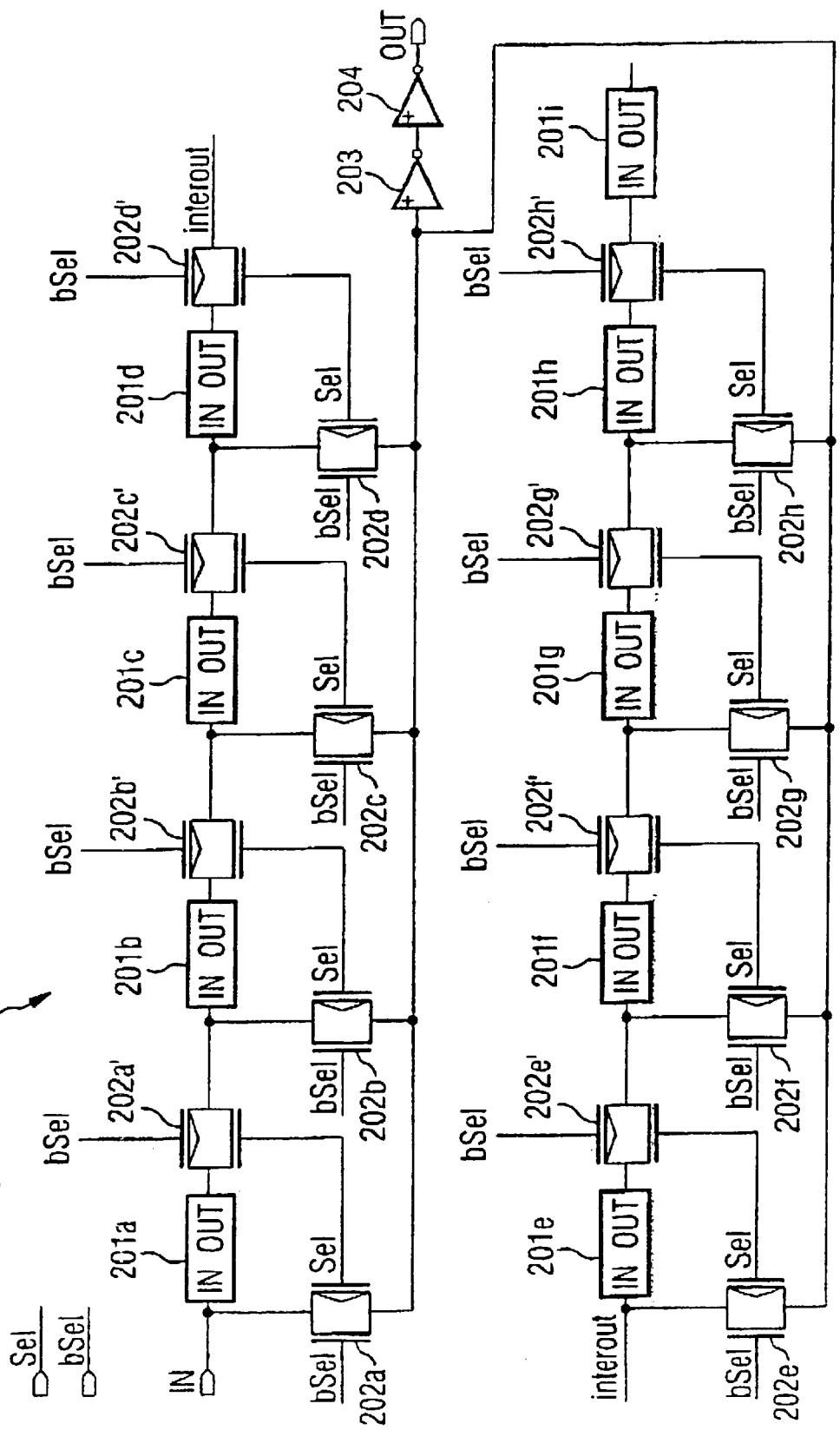

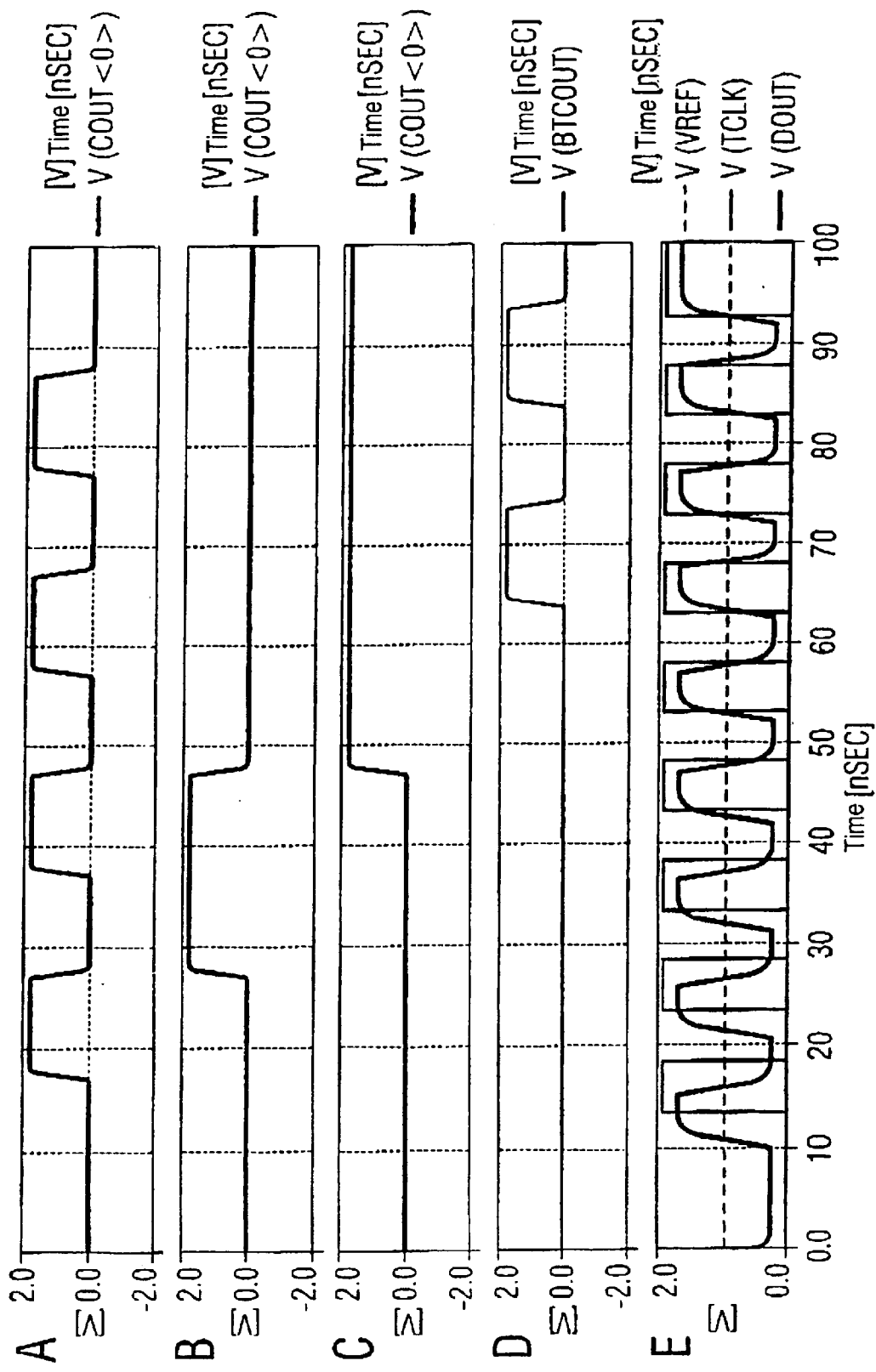

OUTPUT DRIVER CIRCUIT AND METHOD FOR ADJUSTING A DRIVER DEVICE

BACKGROUND OF THE INVENTION

Field of the Invention

The invention relates to an output driver circuit having a driver device, which is connected to a signal input and to a signal output. The invention also relates to a method for adjusting such a driver device.

Output drivers, which are also referred to as off-chip drivers, are a major component of large-scale integrated semi-conductor circuits, particularly DRAMs. The output drivers are used to produce defined voltage signals, which can then be interpreted as binary signals. Furthermore, output drivers may also be used to initiate specific processes in downstream electronic assemblies with the aid of the generated voltage signal.

As a result of increasing clock rates, in particular in the case of DRAMs as well, there is a need for the output time of data to be maintained as exactly as possible. For the output driver, this means that its output generates an output signal at a defined signal amplitude at a predetermined time which (for example, as in the case of synchronous DRAMs) can be coupled to the clock system for synchronization.

One characteristic variable for the synchronicity of the output time of the driver output signal is the time difference between a change in a data item at the output and the clock signal, which predetermines the output time for the change in the data item. The time difference is generally specified as the time interval between the time at which the clock signal crosses half its maximum amplitude and the time at which the output signal from the output driver reaches a predetermined reference voltage.

In the ideal case, the time interval is zero, which means that the output signal from the output driver is synchronized to the clock signal. The optimum operating point is annotated by reference symbol B in FIG. 1. FIG. 1 shows a voltage signal output from an output driver for a synchronous DRAM, in which the signal output is coupled to the system clock. The clock signal is an ideal square-wave signal with a period of 10 ns with a maximum voltage amplitude of 1.8 V. The output signal from the output driver likewise has an essential square waveform with short rise and fall times, that is steep flanks or edges, with the voltage magnitude being 1.6 V, and the signal offset being 0.2 V. A voltage level of 0.9 V is specified as the reference voltage.

The output signal is then interpreted by the downstream assemblies as a logic 1, when it is above the reference voltage, and is interpreted as a logic 0 when it is below the reference voltage.

At the operating point A, FIG. 1 shows the situation in which the output voltage crosses the reference voltage at a time interval $\Delta t_1$ before the time at which the clock signal reaches half its maximum voltage. The change in the data item thus takes place before the clock signal, so that the clock signal and the signal output are not exactly synchronous. The operating point C shows the situation in which the change in the data item, i.e., the time at which the output voltage crosses the reference voltage, lags by the time interval $\Delta t_2$ behind the time at which the time signal corresponds to half the maximum voltage. The output signal from the output driver is not synchronized exactly to the clock signal in this situation either.

In synchronous DRAMs, the time difference between the change in the data item and the clock signal, as shown at the operating point B, should ideally be zero, but, depending on the use of the synchronous DRAM, may also lie within the specified time window, with a maximum specified error of, for example, 750 ps.

A major problem in this case is that the output drivers are subject to production process fluctuations, which influence the desired synchronicity between the output signal from the output driver and the clock signal for the synchronous DRAM. The output time from the output driver circuit furthermore depends, to a major extent, on the operating voltage, on the ambient temperature and, above all, on the load that is connected. An auxiliary circuit is therefore frequently provided for synchronous DRAMs in order to simulate the output driver to make it possible to predict any change in the output time as a result of a change in the operating conditions. The influence of the load (i.e., the downstream electronic component) on the output time cannot, however, be taken into account by such an auxiliary circuit.

SUMMARY OF THE INVENTION

It is accordingly an object of the invention to provide an output driver circuit and a method for adjustment of a driver device that overcome the hereinafore-mentioned disadvantages of the heretofore-known devices and methods of this general type, and that allow the output time of the signals from the output driver to be set exactly, independently of the operating conditions.

With the foregoing and other objects in view, there is provided, in accordance with the invention, a delay device between a signal input and a driver circuit in an output driver circuit, which allows the input signal to the driver device to be delayed by a predetermined value. The signal amplitude of the output signal from the driver device is compared in a comparison device with the signal amplitude of a reference signal at a predetermined time, and the time delay for the input signal to the driver device is then set on the basis of the comparison result.

The output driver circuit and the associated method allow the time at which the input signal is applied to the driver circuit, and hence the time at which the output signal is generated by the driver circuit to be adjusted exactly by adjusting the signal delay value from the delay device that is connected upstream of the driver circuit. The adjusting method is carried out by evaluating the output signal from the driver circuit for a predetermined delay at a predetermined evaluation time. A determination is made at the evaluation time if the output signal has reached a desired reference level, and the delay in the input signal to the driver circuit is then adjusted on the basis of this comparison result. The procedure according to the invention allows the output time for the output signal from the driver circuit to be set exactly independently of the respective operating conditions (that is, independently of the ambient temperature, of the applied operating voltage and, above all, also of the connected load).

In accordance with another feature of the invention, the comparison device is triggered at a predetermined clock rate, in order to repeatedly compare the signal amplitude of the output signal from the driver device with the signal amplitude of the reference signal. The time delay for the input signal to the driver device is lengthened by a predetermined value when the comparison result shows that the signal amplitude of the output signal from the driver device is less than the signal amplitude of the reference signal. However, when the comparison result shows that the signal amplitude of the output signal from the driver device is greater than the signal amplitude of the reference signal, the time delay for the input signal to the driver device is shortened by a predetermined value. This makes it possible to set the output time of the output signal from the output driver circuit to the desired value in a self-adjusting manner, with the delay being matched to the ideal value step-by-step.

In accordance with a further feature of the invention, when the error in the comparison of the signal amplitudes of the output signal and of the reference signal is within a predetermined range, the operating point for the time delay for the input signal and hence the output time of the output signal from the driver circuit are fixed. Alternatively, it is also possible not to fix the operating point, and to allow the time delay, and hence the output time of the output signal of the driver circuit, to oscillate with small errors about the optimum.

With the objects of the invention in view, there is also provided a method of adjusting a driver device connected to a signal input and to a signal output for generating a predetermined output signal in response to an applied input signal, which includes the steps of comparing a signal amplitude of the output signal of the driver device with another signal amplitude of a reference signal at a predetermined time, setting a value for delaying the input signal to the driver device based on a result of the comparing step, and delaying the input signal to the driver device by the given value.

In accordance with a concomitant mode of the invention, the method also includes the steps of repeating the comparison of the signal amplitude of the output signal of the driver device with the signal amplitude of the reference signal at a predetermined clock rate, lengthening the time delay of the input signal to the driver device by a predetermined value when the signal amplitude of the output signal of the driver device is less than the signal amplitude of the reference signal, and shortening the time delay of the input signal to the driver circuit by the predetermined value when the signal amplitude of the output signal of the driver device is greater than the signal amplitude of the reference signal.

Other features which are considered as characteristic for the invention are set forth in the appended claims.

Although the invention is illustrated and described herein as embodied in an output driver circuit and a method for adjustment of a driver device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a graph showing output signals of the voltage comparator of FIG. 2, in relation to different possible signal profiles between an output signal of the output driver and a trigger signal applied to the comparator;

FIG. 4 is a schematic and block diagram of one embodiment of the output driver circuit as shown in FIG. 2;

FIG. 5 is a schematic and block diagram of one possible embodiment of the variable delay device as shown in FIG. 4; and FIGS. 6A–6E are graphs illustrating the signal profiles at a counter, at the voltage comparator and at the output of the output driver, as shown in FIGS. 4 and 5.

DESCRIPTION OF THE PREFERRED EMBODIMENTS

Figure 1:
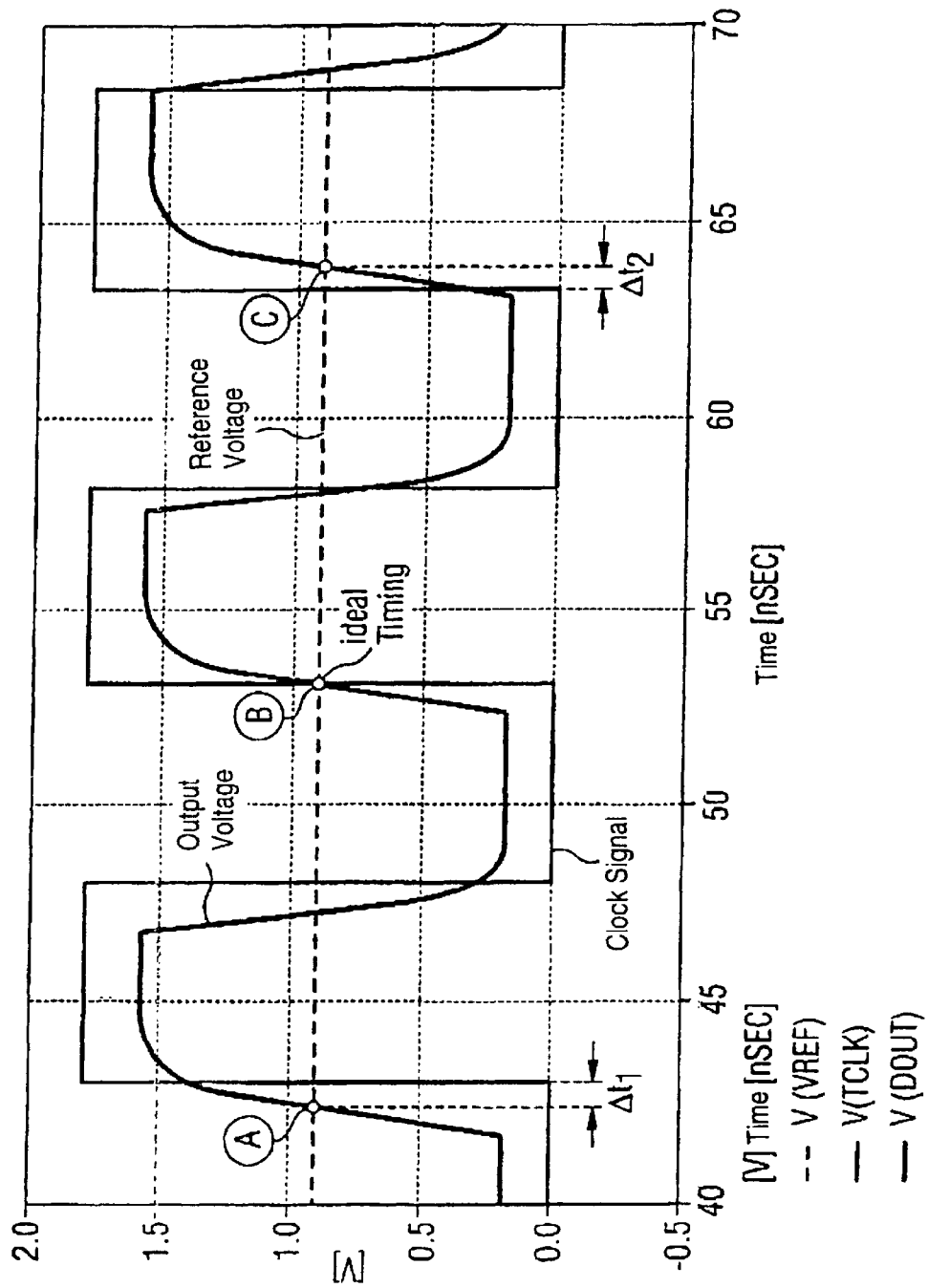
FIG. 1 is a graph illustrating possible voltage profiles between a clock signal and an output voltage from an output driver circuit.

Referring now to the figures of the drawings in detail and first, particularly to FIG. 1 thereof, there is shown a time sequence of an output signal from an output driver circuit, which is related to a system clock signal in a clock-controlled integrated semiconductor memory of the synchronous DRAM (SDRAM) type. Increasing clock rates in large-scale integrated semiconductor memories make it necessary to maintain the time of the data input and data output as exactly as possible. In modern DRAMs, in particular SDRAMs, the data output, which is normally provided via an output driver circuit, is therefore coupled to the system clock signal. In other words, it is synchronized to the system clock signal.

The output driver circuit is normally configured such that the value of a driver output signal, in general a voltage signal, is increased or decreased by a specific value when a driver input signal is applied. The high voltage value and the low voltage value may then be interpreted as a binary signal by a downstream component, for example a microcontroller or a micro-processor. The output driver circuit is required to increase or decrease the value of its output signal with respect to a specific reference level in a predetermined maximum time interval. In that case the output driver signal can be interpreted as a logic 1 when it is above the reference value, and can be interpreted as a logic 0 when it is below the reference value.

The time difference between a change in a data item and the clock signal is specified as the characteristic variable for the synchronicity between the data output from the driver output circuit and the clock signal in the case of an SDRAM. The time difference, which is ideally zero, may also lie within a predetermined time period, for example within a maximum error of 750 ps, depending on the requirement for the SDRAM. The time difference is defined as the time between which the clock voltage amplitude has reached 50% of the maximum value and the time at which the output voltage from the output driver circuit intersects the specified reference voltage, which indicates a change in the data item.

FIG. 1 shows signal profiles for an SDRAM, with the clock signal being an ideal square-wave signal with a period of 10 ns and with a signal amplitude of 1.8 V. The voltage signal of the output driver circuit likewise has a substantially square-wave signal profile with steep flanks or edges, with the voltage maximum being 1.6 V and the voltage minimum being 0.2 V. A voltage level of 0.9 V is shown as the reference voltage value, above which the output voltage signal from the output driver circuit is interpreted as a logic 1, and below which, on the other hand, it is interpreted as a logic 0.

The rising flank or edge of the output voltage from the output driver circuit reaches the 0.9 V level at the operating point A before the time at which the clock signal crosses its 50% value. The change in the data item in the output signal thus actually takes place before the clock signal, and is not synchronized to it. An absolutely synchronous response between the output signal and clock signal is shown at the operating point B. Here, the rising flank or edge of the output signal crosses the reference voltage level at the same time at which the clock signal switches. In contrast, at the operating point C, the change in the data item in the output signal lags behind the clock signal. In other words, the rising flank or edge of the output signal crosses the reference voltage level after the time at which the clock signal switches.

One problem with conventional output driver circuits is that the time at which the output voltage reaches the reference voltage level is dependent on the operating conditions, in particular on the operating voltage, the ambient temperature and, to a major extent, also on the load that is connected. The output time for output driver circuits is also subject to major fluctuations resulting from the production process. The invention proposes a method and an apparatus to overcome this difficulty, and by which the output time of the output signal can be adjusted exactly. By way of example, the invention is intended for adjusting the output time of an output driver circuit in an SDRAM.

The method according to the invention and the corresponding apparatus may, however, in principle be used in all types of output drivers in which the output time is intended to be adjusted, and also particularly in the case of the output driver circuits which, as path drivers, are a component of pulsed semiconductor modules.

Figure 2:
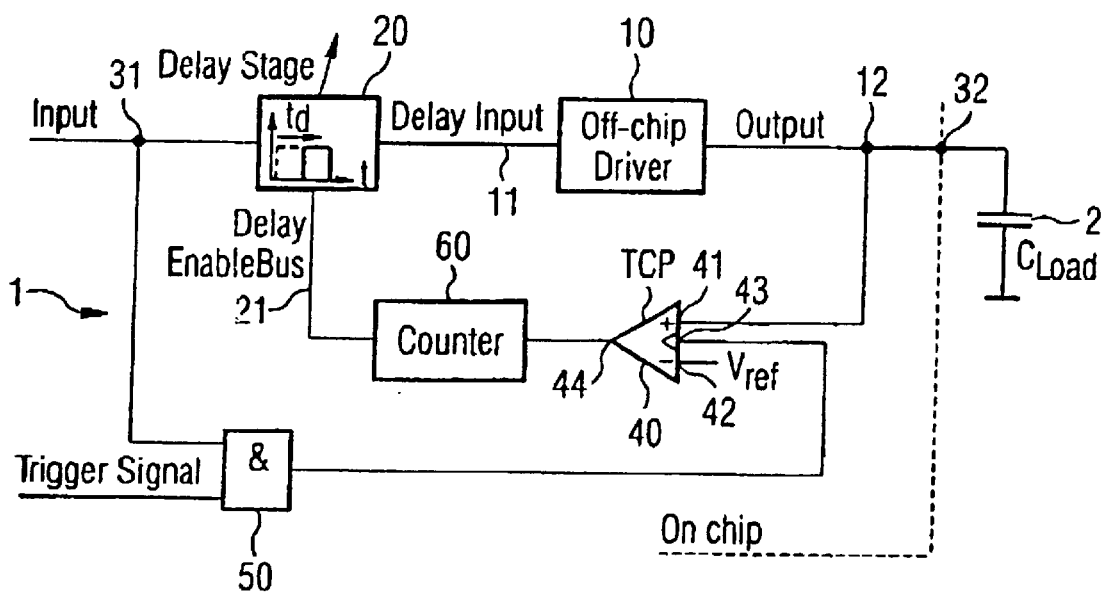
FIG. 2 is a schematic and block diagram of an output driver circuit, according to the invention.

FIG. 2 shows one embodiment of an output driver circuit 1, which allows the output time of the output signal to be set exactly. The output driver circuit may be disposed directly on the SDRAM, or may be provided as a separate circuit, which is connected to a user output of the SDRAM.

The output driver circuit 1 has an output driver 10, which has a signal input 11 to which an input signal can be applied to drive the output driver 10 so that it increases or decreases the voltage value of an output signal at an output 12 to an appropriate voltage level. The output driver 10 is preceded by a delay device 20 (with the input of the delay device being connected to a signal input 31) to which an input signal for the SDRAM can be applied. The delay circuit 20 is used to apply the drive signal, which is applied at the signal input 31, for the output circuit to the driver input, delayed by a predetermined value. The delay device 20 has a control signal line 21 in order to set the delay value.

The output 12 of the output driver 10 is connected to an output contact 32 of the driver output circuit, to which an external capacitive load 2 is connected. This load may be, for example, a microcontroller, a micro-processor, ASIC or some other type of memory module. This (depending on the nature of the load) results in a capacitive load of different magnitude on the output driver circuit, so that currents and time intervals of different magnitude are required in order to produce the desired voltage increase or voltage decrease in the output signal, which can then be interpreted as a binary signal by the capacitive load.

The driver output 12 is also connected to a non-inverted input 41 of a voltage comparator 40. The voltage comparator 40 also has an inverted input 42, to which a reference voltage $V_{ref}$ is applied. The reference voltage $V_{ref}$ preferably corresponds to the voltage level at which the load 2, which is connected to the driver output 32, assumes a change in the data item. The voltage comparator 40 further has a control input 43, to which a trigger signal can be applied. As a reaction to an applied trigger signal, the voltage comparator 40 then compares the signal amplitude of the output signal, which is applied to the non-inverted input 41 of the voltage comparator 40, with the signal amplitude of the reference signal, which is applied to the inverted input 42 of the voltage comparator 40.

The trigger signal for the voltage comparator 40 is produced by a trigger unit 50, whose output is connected to the control input 43 of the voltage comparator 40. The input signal from the user signal input 31 and a trigger signal, which is preferably the system clock signal for the SDRAM, are connected in parallel to the input of the trigger unit 50, which is preferably in the form of an AND gate. Whenever an input signal and a system clock signal are applied at the same time, a trigger signal for the voltage comparator 40 is fed by the trigger unit 50. As a result, the output voltage of the output driver 30 and the reference voltage are compared by the voltage comparator 40. The comparison result is then fed via an output 44 of the comparator 40 to a counter 60, whose output is in turn connected to the signal line 21 for setting the delay value for the delay device 20.

The output time of the output signal at the driver output 12 of the driver 10 can be synchronized to the system clock signal of the SDRAM, which is applied to the trigger unit 50, as follows. The rising flank or edge of the input signal at the user signal input 31 is applied with the current delay setting in the delay device 20 to the input 11 of the output driver 10. The driver 10 then starts, possibly with a delay, to increase the voltage at its driver output 12. The output voltage at the driver output 12 is applied to the non-inverted input 41 of the voltage comparator 40. The reference voltage is applied at the same time to the non-inverted input 42 of the voltage comparator 40. The output voltage of the driver 10, which is applied to the non-inverted input 41, is compared with the reference voltage, which is applied to the inverted input 42, whenever a trigger signal is applied to the voltage comparator 40. The trigger signal is once again applied by the trigger unit 50 whenever a rising flank or edge of the next system clock signal is applied in addition to the input signal. This leads to the voltage comparator 40 comparing the output voltage of the driver 10 with the reference voltage in synchronism with the system clock signal. This further leads to the output voltage being lower than the reference voltage at the comparison time, and the voltage comparator 40 supplying a low voltage level at the output 44. However, in the situation where the output voltage is greater than the reference voltage, the voltage comparator 40 sets the output voltage at the output 44 to a high value. The upper part of the diagram in FIG. 3 shows possible signal profiles (at the inputs 41, 42) and at the output 44 of the comparator 40. The lower part of the diagram shows possible signal profiles at the inputs 41, 42 and 43, as well as one possible voltage profile of the driver output voltage $V_{DOUT}$ with respect to a reference voltage $V_{ref}$ of 0.9 V. The driver output voltage is compared with the reference voltage, with five comparison points a), b), c), d) and e) being shown. The driver output voltage is less than the reference voltage at the comparison times a) and b), so that the voltage comparator supplies a low voltage signal at the output.

In contrast, the driver output voltage is greater than the reference voltage at the comparison points c), d) and e). The voltage comparator indicates this at its output with a high voltage signal (in the present case, the voltage of 1.8 V). The counter 60 is preferably in the form of a binary counter, and is connected to the delay device 20 via the signal line 21. The count determines the delay value that is set with the input signal delay (which is set in the delay device 20) being higher, as the count becomes higher.

Whenever the low voltage level is generated at the output of the voltage comparator 40, the counter 60 decrements its count by one and thus at the same time decreases the delay on the delay device 20 via the signal line 21. However, in the situation where a high voltage level is generated by the voltage comparator 40 at the output 44 in synchronism, the counter 60 is incremented by one, and thus at the same time increases the delay, which is set via the signal line 21, in the delay device 20.

The comparison process then starts once again with the next rising flank or edge of the input signal at the user signal input 31. The delay, which is set in the delay device 20, is thus successively accurately matched to a value at which the output voltage reaches the reference voltage in synchronism with the system clock.

In the described embodiment, which uses a step-up and step-down count, the output time of the output voltage oscillates about the synchronous output time. However, alternatively, it is also possible to configure the voltage comparator such that a fixed delay value is set in the delay device when the error between the output voltage and the reference voltage is within a predetermined value range. Furthermore, it is also possible to calculate an optimized delay value, and then to use this in the delay device, via digital adjustment by a calculation unit in the comparator itself or in a downstream unit, on the basis of the error that is found between the signal amplitude of the output signal and the reference signal at the comparison time. The delay value set in this way can then be optimized further in the course of the subsequent comparison process.

The output driver circuit according to the invention and the described method for setting the delay in the delay device upstream of the output driver make it possible to exactly synchronize the output time of an output flank or edge of the output driver with a system clock signal. The described circuit and the corresponding method may, however, in principle, be used to set the output time of the output signal to any desired predetermined time.

FIGS. 4 and 5 show one embodiment of an output driver circuit 10, as used in a SDRAM. The output 32 of the output driver circuit 10 is connected to the load 2, which is illustrated in the form of a load model. In the illustrated case, the load model simulates, for example, a controller, which is connected downstream from the SDRAM. The load model contains a first resistor 201, which simulates the housing resistance of the SDRAM and is 0.4 Ω. The housing resistance is connected in series with a standard termination 202. The standard termination 202 has a capacitance 203 of 30 pF, to which a resistance 205 of 50 Ω is connected. The resistance 204 is terminated by a voltage 205, which corresponds to the reference voltage $V_{ref}$ and in this case corresponds to half the operating voltage of the output driver circuit of 1.25 V. The output driver 10, to which the load 2 is connected via the output 32, contains two output stages 101, 102, which are driven by a respective inverter circuit 103, 104. The input signal is in turn applied to the inverter circuits 103, 104 in order to drive the output stages 101, 102. Prior to this, the input signal passes through the adjustable delay device, in which case the input signal delay can be adjusted by the digital signal bus 21, to which appropriate selection signals are applied.

The driver output 12 is also connected to the clocked voltage comparator 40, which has the three inputs 41, 42, 43, with the output signal from the driver 10 being applied to the input 41. The reference voltage $V_{ref}$, which corresponds to half the operating voltage of 1.25 V, is applied to the input 42. The clock signal that triggers the comparator is applied to the input 43. The comparator 40 then compares the output voltage applied via the driver 10 with the reference signal, precisely at those times, which are predetermined by the system clock signal.

Depending on the comparison result, the comparator 40 then generates at the output 44 a voltage signal, which corresponds to a logic 0 or a logic 1. The output signal is in turn received by the counter 60, which is a 3-bit step-up/step-down counter in the illustrated embodiment and which may also assume eight different states. The counter 60 is preceded by a sequence controller 61, to which the input signal of the output driver circuit is applied. The input signal is applied to a counter input 162, delayed via an inverter 160 and four delay cells 161, in order to help carry out a synchronous counting process. The counter also has a reset input 163, at which it can be reset. The counter output 164 of the synchronous counter 60 is connected to a demultiplexer 62, which converts the counter signal to 16 parallel signals, with one signal and another signal inverted with respect to the former being produced in each case. The demultiplexer 62 switches an output line to a high voltage level and the inverted output line to a low voltage level depending on the count, which then results in a corresponding signal path in the delay circuit 20 being enabled.

The delay circuit 20 is shown in more detail in FIG. 5. The delay circuit 20 contains nine series-connected delay cells 201, with the last delay cell in the series being a dummy cell 202i. The input signal is applied to the series circuit of delay cells 201. The input signal is in each case tapped off upstream of one delay cell, via a tapping line. Transfer gates 202 are also in each case disposed in the tapping lines and between the individual delay cells and are switched on via the signals generated by the demultiplexer 62.

In order to set the shortest delay, the demultiplexer 62 switches the transfer gate 202a in the first tapping line downward, but in contrast switches on the transfer gate 202a'. The input signal is then fed to the output driver 10 via two downstream inverters 203, 204. If the input signal is intended to pass through the first delay cell 201a, the transfer gates 202a', 202b pass on the signals which are generated by the demultiplexer, while in contrast the transfer gate 202b' is switched off. If the input signal is intended to be delayed by a number of series-connected delay cells 201, the demultiplexer 62 switches on the appropriate transfer gates between the cells, and at the same time opens the transfer gate in the downstream tapping line, but switches off the transfer gate after the next delay cell. The demultiplexer 62 can thus set the input signal delay by activating or switching off the appropriate transfer gates.

FIGS. 6A–6E show a simulation of the control process, which can be carried out by using the embodiment of the output driver circuit shown in FIGS. 4 and 5. FIG. 6E shows the signal profiles of the system clock signal, which is an ideal square-wave signal with a period length of 10 ns, and the readjusted output signal from the output driver circuit. FIG. 6D shows the associated output signal from the clocked comparator 40, and FIGS. 6A–6C show the binary output signal from the counter 60.

At the start of the illustrated control process, the delay that is set in the delay device 20 is short enough to ensure that, at the evaluation time that is predetermined by the clock signal, the output voltage from the driver is greater than the predetermined reference voltage. This leads to the comparator 40 generating a low voltage signal, and the count of the counter 60 is incremented by one. During the next cycle, the output voltage is then moved closer to the reference signal, but the output voltage still remains greater, so that the comparator 40 once again generates a low voltage signal. Thus, the count is once again incremented by one.

In the illustrated control sequence, the output signal is reduced step-by-step to the reference signal, during which process the counter 60 must be incremented four times until, on the fifth measurement, the output signal exceeds the reference signal at the predetermined comparison time. In this case, the output signal from the comparator 40 after the voltage comparison is then set to a high voltage level, in response to which the counter 60 is decremented by one. On the next measurement, the output signal is then once again below the reference signal, so that the counter 60 is incremented by one by the output signal from the comparator, which is now once again set to the low voltage level. Thus, the delay oscillates continuously about the optimum operating point.

The features of the invention which are disclosed in the above description, in the claims and in the drawings may be significant for the implementation of the various embodiments of the invention both individually and in any desired combination.

I claim:

1. An output driver circuit, comprising:
   a signal input and a signal output;
   a driver device connected to said signal input and to said signal output for generating a predetermined output signal in response to an applied input signal;
   an adjustable delay device disposed between said signal input and said driver device, said delay device configured for delaying an input signal to the driver device in accordance with a given value; and
   a triggered comparison device connected to said delay device and to said driver device, said triggered comparison device receiving a reference signal, and said triggered comparison device configured to compare a signal amplitude of the output signal of said driver device with another signal amplitude of the reference signal in response to an applied trigger signal, and to set the value based on a comparison result.

2. The output driver circuit according to claim 1, further comprising:
   a sequence controller connected upstream of said triggered comparison device;
   said comparison device receiving the trigger signal at a predetermined clock rate; and
   said triggered comparison device configured to lengthen a time delay of the input signal to said driver device by a predetermined value upon the signal amplitude of the output signal of said driver device being less than the signal amplitude of the reference signal, and to shorten the time delay of the input signal to said driver device by the predetermined value upon the signal amplitude of the output signal of said driver device bring greater than the signal amplitude of the reference signal.

3. A method of adjusting a driver device connected to a signal input and to a signal output for generating a predetermined output signal in response to an applied input signal, which comprises the steps of:
   comparing a signal amplitude of the output signal of the driver device with another signal amplitude of a reference signal at a predetermined time in response to an applied trigger signal;
   setting a value for delaying the input signal to the driver device based on a result of the comparing step; and
   delaying the input signal to the driver device by the given value.

4. The method according to claim 3, which further comprises the steps of:
   repeating the step of comparing the signal amplitude of the output signal of the driver device with the signal amplitude of the reference signal at a predetermined clock rate;
   lengthening the time delay of the input signal to the driver device by a predetermined value upon the signal amplitude of the output signal of the driver device being less than the signal amplitude of the reference signal; and
   shortening the time delay of the input signal to the driver circuit by the predetermined value upon the signal amplitude of the output signal of the driver device being greater than the signal amplitude of the reference signal.

* * * * *